United States Patent
Heflinger

(10) Patent No.: US 6,404,365 B1
(45) Date of Patent: *Jun. 11, 2002

(54) FULLY OPTICAL ANALOG TO DIGITAL CONVERTERS WITH COMPLEMENTARY OUTPUTS

(75) Inventor: Donald Glen Heflinger, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/630,418

(22) Filed: Aug. 1, 2000

Related U.S. Application Data

(63) Continuation of application No. 09/098,844, filed on Jun. 17, 1998, now Pat. No. 6,118,397.

(51) Int. Cl.$^7$ ................................................ H03M 1/00
(52) U.S. Cl. ...................................... 341/137; 359/245
(58) Field of Search ............................... 341/137, 155, 341/156; 359/237, 245, 127; 385/4, 5, 46

(56) References Cited

U.S. PATENT DOCUMENTS

| | | | | |
|---|---|---|---|---|
| 3,985,423 A | | 10/1976 | Tseng ........................... | 350/96 |
| 4,441,096 A | | 4/1984 | Evanchuk .................... | 340/347 |
| 4,502,037 A | * | 2/1985 | Le Parquier ................. | 340/347 |
| 4,694,276 A | * | 9/1987 | Rastegar ...................... | 341/137 |
| 4,712,089 A | | 12/1987 | Verber .......................... | 340/347 |
| 4,851,840 A | | 7/1989 | McAulay ..................... | 341/137 |
| 4,926,177 A | | 5/1990 | Sakata .......................... | 341/137 |
| 4,947,170 A | * | 8/1990 | Falk ............................. | 341/137 |
| 5,039,988 A | | 8/1991 | Hong ........................... | 341/137 |
| 5,253,309 A | * | 10/1993 | Nazarathy ...................... | 385/4 |
| 5,381,147 A | | 1/1995 | Birkmayer et al. .......... | 341/137 |
| 5,565,867 A | | 10/1996 | Tiemann ...................... | 341/143 |
| 5,835,212 A | * | 11/1998 | Kissa et al. .................. | 356/345 |

\* cited by examiner

*Primary Examiner*—Peguy Jeanpierre
(74) *Attorney, Agent, or Firm*—Connie M. Thousand

(57) ABSTRACT

A fully optical converter for converting an analog signal into a digital signal includes an amplitude to optical wavelength converter for converting the analog signal into an optical signal which varies in wavelength in accordance with an amplitude of the analog signal, a splitter for applying the optical signal over a desired number of light paths, an interferometer connected to each of the light paths, unequal path lengths in each leg of the interferometers to allow optical interference to deliver a complementary sinusoidal transfer function to the optical signal to generate two complimentary output signals and a dual detector connected to each of the interferometers for generating a digital bit in response to the two complimentary output signals, wherein each of the digital bits together form a parallel digital word. The fully optically based converter is automatic and independent of interactive techniques, thus providing for an expedited conversion rate.

14 Claims, 2 Drawing Sheets

FULLY OPTICAL ANALOG TO DIGITAL CONVERTERS WITH COMPLEMENTARY OUTPUTS

This application is a continuation of U.S. patent application Ser. No. 09/098,844 having a filing date of Jun. 17, 1998 now U.S. Pat. No. 6,118,397.

BACKGROUND OF THE INVENTION

The present invention relates generally to analog to digital converters, and more particularly to all optical analog to digital converters.

It is often desirable to convert an analog amplitude varying signal to a digital set of values which corresponds to various voltages in the analog waveform to generate a corresponding digital signal. Conventional approaches generally rely ion iterative and/or comparative techniques for determining a digital signal based on an analog waveform voltage. In particular, a common conventional approach compares the actual voltage of the analog amplitude varying signal to a comparison voltage which is generated from a digital word. Various digital words are utilized to create comparison voltages which are then rapidly compared to the actual voltage to determine whether the comparison voltages are greater or less than, in an instant of time, the analog amplitude varying signal. Through a continuous iterative and/or comparative process, a digital word which corresponds to the actual voltage of the analog amplitude varying signal is generated. The digital word is recorded for that instant of time and the same iterative and/or comparative process is repeated for subsequent instants of time corresponding to the analog signal. This conventional method suffers from various shortcomings, including but not limited to, errors and time inefficiency due to the iterative process.

What is needed therefore is an apparatus and method for converting an analog signal into a digital signal which is automatic, accurate, time efficient and does not rely on iterative techniques.

SUMMARY OF THE INVENTION

The preceding and other shortcomings of the prior art are addressed and overcome by the present invention which provides, in a first aspect, an apparatus for converting an analog signal into a digital signal, including a converter which converts the analog signal into an optical signal which varies in wavelength in accordance with an amplitude of the analog signal, a splitter which applies the optical signal over a preselected number of light paths, an interferometer connected to each of the light paths which applies a sinusoidal transfer function to the optical signal to generate two complimentary output signals; and, a detector connected to each of the interferometers which generates a digital bit in response to the two complimentary output signals, wherein each of the digital bits are combined to form a parallel digital word.

In another aspect, the present invention provides a method for converting an analog signal into a digital signal, including the steps of converting the analog signal into an optical signal which varies in wavelength in accordance with an amplitude of the analog signal, splitting the optical signal over a preselected number of light paths, applying a sinusoidal transfer function to the optical signal over each of the light paths to generate two complimentary output signals and generating a digital bit in response to the two complimentary output signals, wherein each of the digital bits are combined to form a parallel digital word.

The foregoing and additional features and advantages of this invention will become apparent from the detailed description and accompanying drawing figures below. In the figures and the written description, numerals indicate the various features of the invention, like numerals referring to like features throughout both the drawing figures and the written description.

DETAILED DESCRIPTION OF THE PREFERRED EMBODIMENTS

Figure 1:
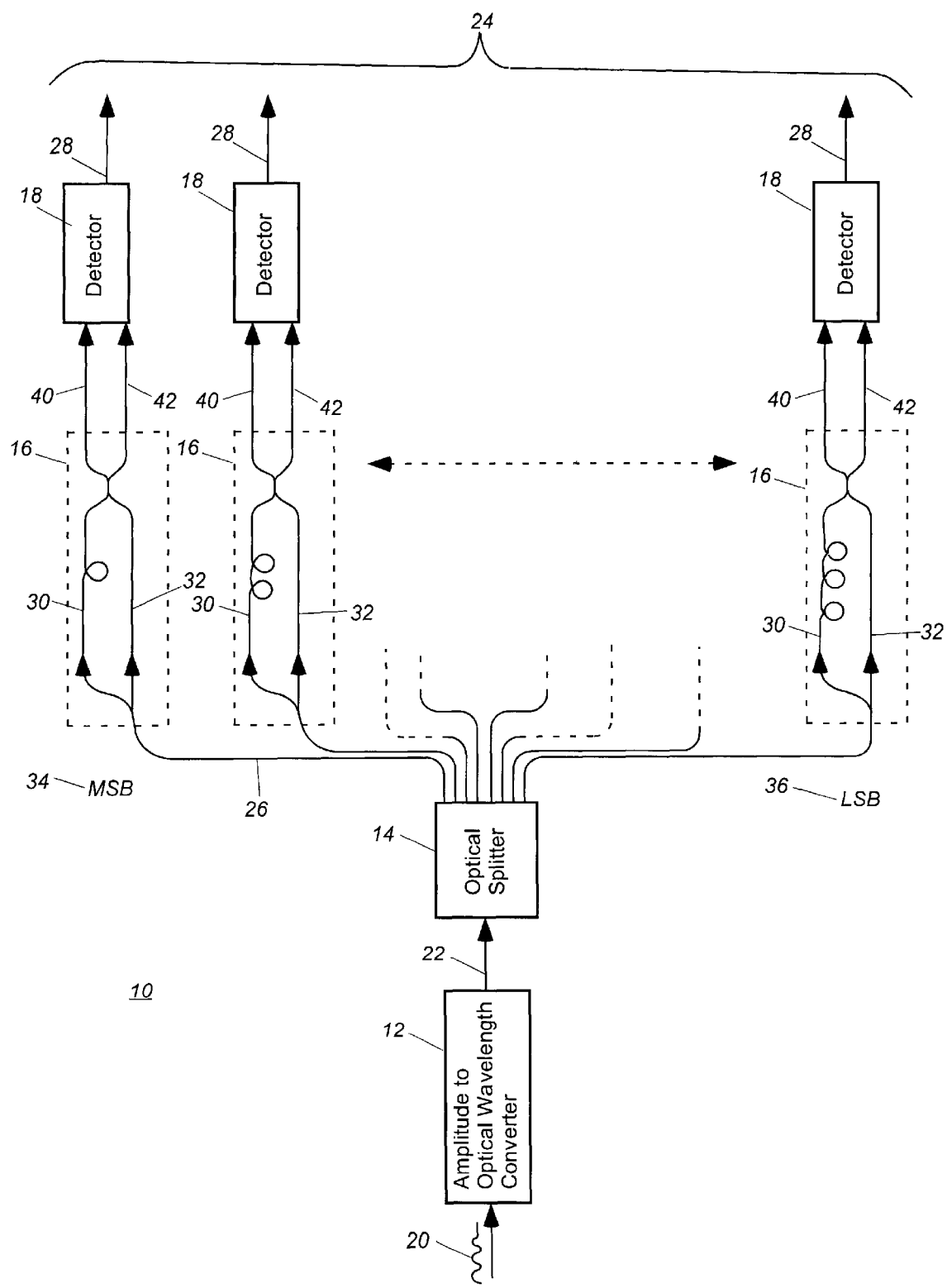
FIG. 1 is a schematic diagram of a fully optical analog to digital converter in accordance with the present invention.

As is illustrated in FIG. 1, the present invention provides a fully optical analog to digital converter 10 which is automatic and independent of iterative techniques, thus providing for an expedited conversion rate. In particular, the converter 10 includes an amplitude to optical wavelength converter 12, optical splitter 14, interferometers 16 and detectors 18. The fully optical analog to digital converter 10 initially converts an analog signal 20, such as a signal in the radio frequency (RF) range, into an optical signal 22 which varies in wavelength in accordance with the analog signal 20. The amplitude of the optical signal 22 remains constant as the wavelength is varied over a range which corresponds to the analog amplitude of the analog signal 20. In accordance with the present invention, the wavelength variation on the optical signal 22 is utilized to generate a corresponding parallel digital word 24.

In particular, referring to FIG. 1, the analog signal 20 is applied to the amplitude to optical wavelength converter 12 for converting the analog signal 20 into an optical signal 22 which varies in wavelength in accordance with the amplitude of the analog signal 20. The amplitude to optical wavelength converter 12, preferably one or more laser diodes, has an output which is a function in wavelength of how the converter 12 is driven. For example, a laser diode which is driven by a larger amplitude signal will generally have a longer output wavelength than a laser diode driven by a smaller amplitude signal. The present invention is not limited to the use of laser diodes for converting the analog signal 20 into an optical signal, but rather any device including a broadband light source having a large bandwidth for optical gain can be utilized in conjunction with an optical filter that tunes with the signal amplitude. Such devices include, but are not limited to, fiber lasers, optical fiber amplifiers, and other solid state amplifier systems.

The wavelength varying optical signal 22 generated by the converter 12 is applied to the splitter 14 which splits the optical signal 22 into a desired number of light paths 26. Each path 26 is utilized to create a digital bit 28 in the final parallel digital word 24. The number of paths 26 the wavelength varying optical signal 22 is split into is dependent on the desired level of resolution. For example, as illustrated in FIG. 1, for 8-bit resolution (256 signal levels), the wavelength varying optical signal 22 is split into eight light paths 26. The splitter 14 is preferably an active multimode signal splitter, such as the splitter disclosed in U.S. patent application Ser. No. 08/866,656, filed May 30, 1997, entitled "Active Multimode Optical Signal Splitter", assigned to the same Assignee as the present invention and incorporated herein for reference. The splitter 14, in addition to splitting the optical signal 22, maintains the intensity of each optical signal along each light path 26 approximately the same, thus allowing the optical signal 22 to be split into a greater number of equal light paths 26 without loss in light intensity. The optical splitter 14 could alternatively be a conventional or newly developed splitter, such as a fiber optic star coupler which is manufactured from a group of optical fibers which have their cladding layer removed prior to being twisted together. This allows the light in one fiber to evanescently couple equally into all the other fibers thereby allowing the wavelength varying optical signal 22 to be split.

As is illustrated in FIG. 1, each of the split light paths 26 is applied to an interferometer 16, preferably a Mach-Zender interferometer, which splits the light from each path 26 into two split out interferometer paths 30 and 32 and then combines the two paths 30 and 32 interferometrically to generate two complimentary output signals 40 and 42. The two path lengths 30 and 32 of each interferometer 16 are unequal in length by an amount corresponding to the weighting factor required for a particular bit that the split light path is to represent in the final parallel digital word 24. In particular, the light 26 is split into the two unequal path lengths 30 and 32 of the interferometer 16 so that when the two paths 30 and 32 are combined, optical interference directs the light proportionally into the two complimentary output signals 40 and 42 according to a sinusoidal transfer function depending on the wavelength of light. The difference in the length of the two paths 30 and 32 is determined by the optical path length difference required to make the desired optical interference cycle through the complementary sinusoidal partition of the light between legs 30 and 32 the same number of times as the particular bit changes in the parallel digital word 28. Each interferometer 16 has a unique path length difference corresponding to each digital bit. The longer path 30 in each Mach-Zender interferometer 16 is generally different from the others enabling the short path 32 to be the same length for all interferometers.

In operation, as the wavelength of light is swept through the range of wavelengths corresponding to the analog signal amplitude, the output of each interferometer 16 is a complementary sinusoidal variation in the intensity partitioned between the two output signals 40 and 42. The interferometer 16 for the most significant bit delivers just one cycle of variation in intensity. The interferometer 16 for the next most significant bit experiences two complete cycles. The next most significant bit experiences four cycles, the next experiences eight cycles, and the pattern continues to increase as a power of two for successively less significant digital bits. The most significant bit (MSB) 34 will only go through one complementary sinusoidal cycle change for the entire analog domain. For 8-bit resolution, the least significant bit (LSB) 36, the eighth bit, will go through one hundred and twenty eight complementary sinusoidal cycles of variation in intensity for the entire analog domain. The interferometer 16 may be a monolithic frequency division multiplexer DM) manufactured by Photonic Integration and Research, Inc. of Columbus, Ohio, under a typical model number like FDM-10G-1.5, which corresponds to an unbalanced interferometer that delivers one cycle of intensity variation when the light wavelength at 1.5 um is changed by 0.08 nm (a frequency change of 10 GHz). Although the interferometers 16 are illustrated in FIG. 1 as separate units, they are not limited to such a configuration but rather may be configured monolithically on the same wafer device. The interferometers may also be made from fiber optic cable and fiber optic couplers through the use of either polarization maintaining fiber or polarization controllers.

Figure 2:
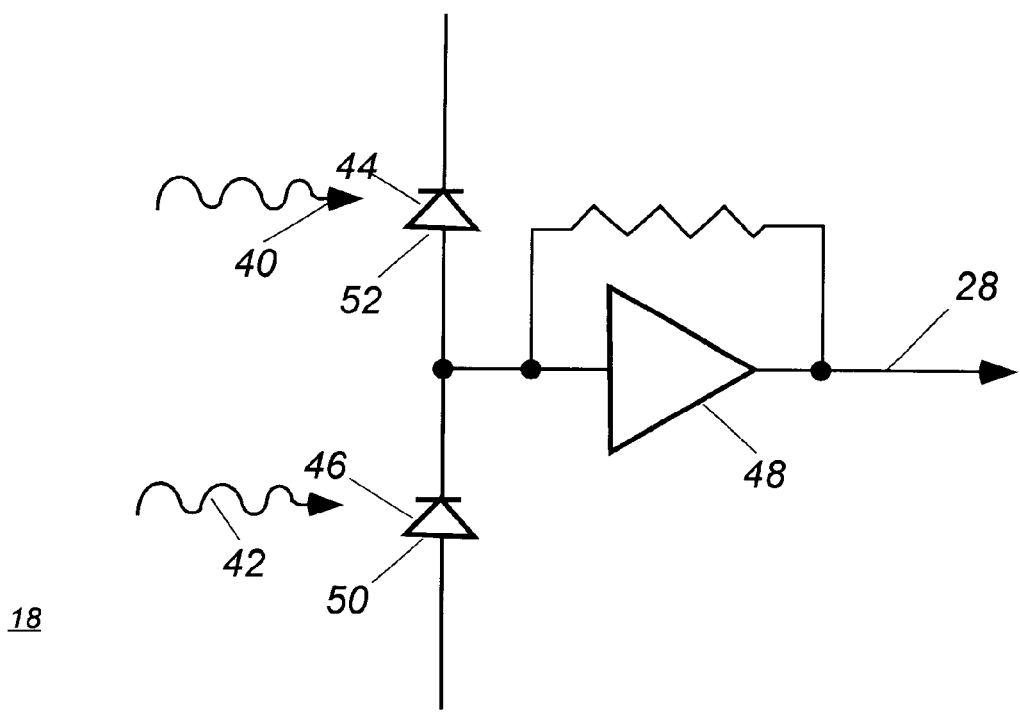
FIG. 2 is a detailed diagram of the detector circuit illustrated in FIG. 1.

The output light distribution in the two output legs 40 and 42 is determined by the particular wavelength of light that is initially applied to the interferometer 16. The wavelength of light establishes the particular interference phase state with which the light from the two unequal paths 30 and 32 interferes when they are combined at the output of the interferometer 16. This phase state determines how the light becomes partitioned into the two output legs 40 and 42. The length of the optical delay in path 30 relative to path 32 determines the wavelength range over which the light must be varied to establish the same phase state corresponding to a full complementary sinusoidal intensity variation that will lead to the same partition of light in the two output legs 40 and 42. To achieve this sinusoidal intensity variation, the split ratio dividing the light into paths 30 and 32, the combining ratio at the output of the interferometer 16, and the split ratio into output legs 40 and 42 all need to be approximately 50:50. In accordance with this complementary sinusoidal intensity variation, there is a particular phase state that As is illustrated in FIG. 2, the photodiodes 44 and 46 are connected in series in a balanced configuration. In particular, the anode 52 of one photodiode 44 is connected to the cathode 50 of the other photodiode 46. When light is applied to the photodiode 44, current is conducted from the input of the limiting electronic amplifier 48 in a direction as shown by the arrow associated with the photodiode 44. When light is applied to the other photodiode 46, current is conducted in an opposite direction into the input of the limiting electronic amplifier 48 as shown by the arrow associated with the photodiode 46.

Referring to FIGS. 1 and 2, when applied to the photodiode 44, the first complimentary output signal 40 creates a current having a magnitude proportional to the intensity of the light in the first complimentary output signal 40. Similarly, when applied to the photodiode 46, the second complimentary output signal 42 creates a current having a magnitude proportional to the intensity of the light in second complimentary output signal 42. If the resulting current is applied to the amplifier 48 in a first direction, then the first complimentary output signals 40 is greater in intensity. Similarly, if the resulting current is applied to the limiting electronic amplifier 48 in a second direction, then the second complimentary output signals 42 is greater in intensity. In this way, it can be determined which of the two legs 40 or 42 is greater in intensity. Thus, in accordance with the present invention, it is unnecessary to know the absolute level of light or compare the absolute level of light to any other value to determine whether the absolute level of light is above or below a threshold value. In addition, this :relative comparison of the light intensities in the two complimentary output signals 40 and 42 enables the use of converters 12 which vary in output intensity with changes in wavelength, as is the case with laser diodes.

In the present invention, by determining when the light swings from being more intense in one complimentary output signal 40 than in the other complimentary output signal 42, the transition between a "0" and "1" state for a bit can be determined. The transition occurs at a particular distinct point which is a function of a particular wavelength of light which is sent through the interferometer 16 and is not influenced by the intensity level delivered to interferometer 16. Through the use of a limiting electronic amplifier 48, the output signal 28 can be made to achieve commonly used digital voltage levels for "0" and "1" bits.

The present invention is not limited to the detector described or illustrated herein. The present invention may also be utilized with other detectors, including but not limited to the two complimentary output signals 40 and 42 of the interferometer 16 being connected to a photodiode (not shown) whose output is applied individually to a transimpedance amplifier (not shown) that is uniquely associated with each photodiode. The output of one transimpedance amplifier is then electrically inverted and resistively summed with the output of the other transimpedance amplifier to create a resulting signal that is then sent to a limiting amplifier to create electronic digital "1" and "0" bits for the output signal 28. The detector configuration described herein is preferable for operation at higher speeds where the photodiode capacitance may effect the output because the capacitance becomes doubled when photodiodes are connected together as anode to cathode. In addition, the individual connection of each photodiode to its own electronic amplifier allows the use of resistively terminated photodiodes commercially available from manufactures such as Lasertron as QDMH1-055 where a 50 ohm resistor is packaged directly across the photodiode for impedance matching to 50 ohms. Thus, in accordance with an advantage of the present invention, every analog voltage is initially converted to a particular wavelength utilizing a one-to-one correspondence. An optical light beam 22 having a particular wavelength is generated and transmitted through an interferometer 16, which through a conversion process outputs a parallel digital word 24, without relying on a trial and error process.

In operation, in a typical configuration, a laser diode 12 modulable in wavelength by 0.08 nm via variation of the drive current is directly modulated by an analog RF signal 20 to create a wavelength varying optical signal 22. For a typical distributed feedback (DFB) laser diode, a 9 ma current variation to the drive of the laser diode 12 operating at 1.55 um creates a wavelength variation of 0.08 nm that will deliver a single complementary sinusoidal intensity variation cycle in a single-mode fiber Mach-Zender interferometer 16 that has a path difference of 2 cm assuming an optical fiber refractive index for the Mach-Zender interferometer 16 of 1.46. The wavelength variation delivered by the laser diode is a consequence of the heating from the increase in drive current at a rate of roughly 0.7 Angstroms per degree C. An intensity variation in the output light of the laser also takes place from this current variation in the drive; however, the present invention is insensitive to this intensity variation because it is unnecessary to know the absolute intensity of the light. A Mach-Zender interferometer 16 having a 2 cm path difference is utilized for the most significant bit (MSB), with the, Mach-Zende interferometers 16 for the other bits requiring larger differences in path length as indicated below in Table I. The least significant bit (LSB) in an eight bit analog to digital converter 10 requires a Mach-Zender interferometer 16 with a path difference of 2.5 m, which is approximately 128 times the 2 cm path difference of the most significant bit. A Mach-Zender interferometer 16 having a 2.5 m path difference limits the upper frequency which can be converted to a digital word 24 to something less than 80 MHz, which is the frequency at which the propagation delay completely prevents optical interference of the signal with itself.

TABLE I

Parameters for a 0.8 Angstrom Wavelength Variation

| Digital Bit | Path Difference (m) | Intensity Cycles | Upper Interference Frequency (MHz) |
|---|---|---|---|
| 7 MSB | 0.02 | 1 | 10000 |
| 6 | 0.04 | 2 | 5100 |
| 5 | 0.08 | 4 | 2600 |
| 4 | 0.16 | 8 | 1300 |
| 3 | 0.32 | 16 | 640 |
| 2 | 0.64 | 32 | 320 |
| 1 | 1.28 | 64 | 160 |
| 0 LSB | 2.56 | 128 | 80 |

For an amplitude to optical wavelength converter 12 covering a wavelength range that is 100 times larger, namely 8.0 nm, the path length differences can be reduced by a facto 100 and the upper frequency limit for analog to digital conversion can be set at 4 Ghz for eight-bit resolution.

It will be appreciated by persons skilled in the art that the present invention is not limited to what has been shown and described hereinabove, nor the dimensions of sizes of the physical implementation described immediately above. The scope of invention is limited solely by the claims which follow.

What is claimed is:

1. An apparatus for converting an analog signal having a continuously varying amplitude into a digital signal, comprising:
   a converter which converts said analog signal into an optical signal which is tuned continuously in wavelength in accordance with the continuously varying amplitude of said analog signal;
   a splitter which applies said optical signal at a selected wavelength over a preselected number of light paths;
   an interferometer connected to each of said light paths which applies a complementary sinusoidal transfer function to said optical signal to generate two complimentary output signals; and
   a detector connected to each of said interferometers which generates a digital bit in response to said two complimentary output signals, wherein each of said digital bits are combined to form a parallel digital word.

2. The apparatus claimed in claim 1, wherein said converter comprises a laser diode.

3. The apparatus claimed in claim 1, wherein said splitter comprises an active multimode signal splitter.

4. The apparatus claimed in claim 1, wherein said splitter comprises a fiber optic star coupler.

5. The apparatus claimed in claim 1, wherein said interferometer comprises a Mach-Zender interferometer having two first split out interferometer paths for dividing said optical signal into two equal light intensity signal, a recombining path for recombining said two first split out interferometer paths to allow optical interference between two said equal light intensity signals to create two complementary output signals; and,
   two second split out interferometer paths to output said two complementary output signals.

6. The apparatus claimed in claim 5, wherein said two first split out interferometer paths are unequal in length by an amount corresponding to a weighting factor for a particular digital bit.

7. The apparatus claimed in claim 6, wherein said two complementary output signals deliver a complementary sinusoidal transfer function to a dual photodetector.

8. The apparatus claimed in claim 7, wherein said complementary sinusoidal transfer function varies in accordance with a preselected wavelength of light.

9. The apparatus claimed in claim 1, wherein said detector comprises a balanced detector.

10. A method for converting an analog signal having a continuously varying amplitude into a digital signal, comprising the steps of:

converting said analog signal into an optical signal which is tuned continuously in wavelength in accordance with the continuously varying amplitude of said analog signal;

splitting said optical signal at a selected wavelength over a preselected number of light paths;

applying a complimentary sinusoidal transfer function to said optical signal over each of said light paths to generate two complimentary output signals; and, generating said digital bit in response to said resulting current, wherein each of said digital bits are combined to form a parallel digital word.

11. The method claimed in claim 10, wherein said step of applying a complimentary sinusoidal transfer function further comprises the step of:

utilizing an interferometer to apply a complimentary sinusoidal transfer function to said optical signal over each of said light paths to generate said two complimentary output signals.

12. The method claimed in claim 11, wherein said step of utilizing an interferometer to apply a complimentary sinusoidal transfer function to said optical signal, further comprises the steps of:

utilizing an interferometer to split said optical signal into two equal light intensity signals;

recombining said two equal light intensity signals to create said two complementary output signals; and, outputting said two complementary output signals.

13. The method claim in claim 12 further comprising the step of:

applying said complimentary sinusoidal transfer function to one of said equal light intensity signals.

14. The method claimed in claim 13 wherein said step of applying said complimentary sinusoidal transfer function further comprises the step of:

determining said complimentary sinusoidal transfer function in accordance with a preselected wavelength of light.

* * * * *